United States Patent [19]

Kurakane

[11] Patent Number: 5,743,749
[45] Date of Patent: Apr. 28, 1998

[54] ELECTRONIC COMPONENT CONNECTOR

[75] Inventor: Takashi Kurakane, Tokyo, Japan

[73] Assignee: Tesec Corporation, Japan

[21] Appl. No.: 749,987

[22] Filed: Nov. 15, 1996

[30] Foreign Application Priority Data

Nov. 17, 1995 [JP] Japan .................................. 7-300161

[51] Int. Cl.⁶ .................................................. H01R 9/09
[52] U.S. Cl. ................................................ 439/72; 439/71
[58] Field of Search ........................... 439/68, 70, 72, 439/73, 912, 525, 592, 931, 71

[56] References Cited

U.S. PATENT DOCUMENTS

5,035,629  7/1991  Matsuoka .................... 439/70
5,073,117  12/1991  Malhi et al. ................. 439/912

*Primary Examiner*—Neil Abrams
*Attorney, Agent, or Firm*—Blakely Sokoloff Taylor & Zafman

[57] ABSTRACT

In an electronic component connector, terminals are formed on a measurement circuit board. Support members are provided on the measurement circuit board to correspond to the terminals. The support members respectively have free end portions arranged in a row to correspond to a plurality of lead terminals extending from an electrical component and proximal end portions cantilevered by the measurement circuit board. Contacts are insulated from each other and provided to the free end portions of the support members to normally oppose the terminals through a predetermined gap. The contacts respectively have first contact portions to come into contact with the lead terminals of the electrical component and second contact portions to come into contact with the terminals at positions, in a longitudinal direction of the support members, different from positions where the first contact portions come into contact with the terminals. The lead terminals of the electrical component are positioned to correspond to the contacts, and thereafter the electrical component is pressed against an elastic force of the support members in a direction to come close to the measurement circuit board, thereby electrically connecting the terminals and the lead terminals of the electrical component through the contacts.

17 Claims, 5 Drawing Sheets

ELECTRONIC COMPONENT CONNECTOR

BACKGROUND OF THE INVENTION

The present invention relates to an electronic component connector used to measure the characteristics of an electronic component, e.g., a very high-frequency element.

In recent years, a strong demand has arisen for a semiconductor device comprising an electronic component and, in particular a 3 to 10-GHz band very high-frequency element, and a demand for an electronic component connector that can be used in a very high-frequency band has been increasing accordingly. In measurement of the characteristics of such a very high-frequency electronic component, when long contacts extending from the main body of the measurement unit are used, the influence of inductance and stray capacitance increases. Therefore, it is preferable that short as possible contacts be used. When the contacts and the main body of the measurement unit are connected through cables, a measurement error occurs due to the influence of the inductance and stray capacitance of the cables. Therefore, the contacts are conventionally, generally located directly on the measurement circuit board.

Figure 11:
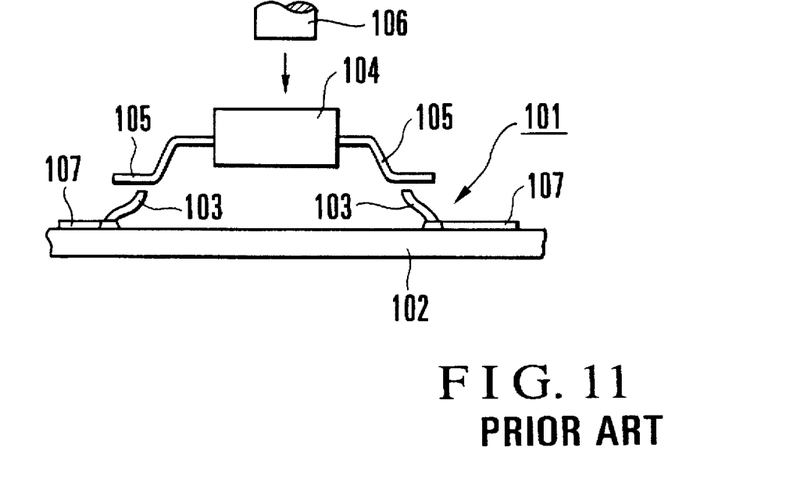
FIG. 11 shows a conventional electronic component connector.

FIG. 11 shows a conventional electronic component connector used in measurement of the characteristics of a very high-frequency electronic component. In this electronic component connector 101, two rows of a plurality of contacts 103 made of belt-like metal segments are arranged on a measurement circuit board 102. A plurality of lead terminals 105 extending from an electronic component 104 are disposed on the contacts 103 to correspond to them. Thereafter, the electronic component 104 is pressed toward the measurement circuit board 102 with a predetermined pressure by using a pressing member 106 to obtain good electrical contact between the contacts 103 and the lead terminals 105. In this state, a current or voltage is applied to the electronic component 104 through terminals 107 of the measurement circuit board 102, thereby measuring the electrical characteristics of the electronic component 104.

If, however, oxide films are formed on the surfaces of the contacts 103 of the electronic component connector 101 or the lead terminals 105 of the electronic component 104 or if these surfaces are soiled, the oxide films or contamination forms insulating layers to disable good electrical connection. For this reason, in measurement, the contacts 103 are usually brought into slidable contact with the surfaces of the lead terminals 105 with a predetermined elastic force through an operation called a wiping action utilizing the spring properties of the contacts 103, so that good electrical connection can be obtained. The proximal end portions of the contacts 103 are fixed on the terminals 107 with soldering.

AS described above, in the characteristic test in a very high-frequency band, in order to decrease the inductance and stray capacitance and to increase the measurement accuracy, the contacts 103 are provided directly on the measurement circuit board 102 and the contacts 103 are formed as small segments. For example, when the contacts 103 are formed into a length of 1 mm or less, to increase the contact pressure with the lead terminals 105, the rigidity of the contacts 103 must be increased. At the same time, a certain elastic deformation amount is required for the contacts 103 in order to maintain the height accuracy of the distal end portions of the contacts 103 and the height accuracy of the lead terminals 105 themselves. Therefore, when the electronic component connector 101 is used repeatedly, the contacts 103 are broken due to metal fatigue. In particular, to increase the rigidity of the contacts 103 by forming them with spring members, the plate thickness of the contacts 103 must be increased. This, however, causes a typical metal fatigue to decrease the durability. Also, when the rigidity of the contacts 103 is increased, a sufficiently large elastic deformation amount cannot be obtained.

Furthermore, in order to effect a wiping action aiming at obtaining good electrical contact with the lead terminals 105, the contacts 103 must elastically deform to a certain degree even after the lead terminals 105 start to come into contact with them. Therefore, the smaller the contacts 103, the more largely the above problem occurs, making it difficult to perform high-accuracy measurement.

SUMMARY OF THE INVENTION

It is an object of the present invention to provide an electronic component connector for contacts that can obtain a good wiping action without imparting the contacts with elasticity.

It is another object of the present invention to provide an electronic component connector capable of downsizing the contacts and having an improved durability.

It is still another object of the present invention to provide an electronic component connector which can be suitably used in measurement of the characteristics of an electronic component having very high-frequency characteristics.

In order to achieve the above objects, according to the present invention, there is provided an electronic component connector comprising a plurality of conductive terminals formed on an insulating substrate, a plurality of belt-like support members provided on the insulating substrate to correspond to the conductive terminals, the support members respectively having free end portions arranged in a row to correspond to a plurality of lead terminals extending from an electrical component and proximal end portions cantilevered by the insulating substrate, and a plurality of conductive contacts insulated from each other and provided to the free end portions of the support members to normally oppose the conductive terminals through a predetermined gap, the conductive contacts respectively having first contact portions to come into contact with the lead terminals of the electrical component and second contact portions to come into contact with the terminals at positions, in a longitudinal direction of the support members, different from positions where the first contact portions come into contact with the terminals, wherein the lead terminals of the electrical component are positioned to correspond to the conductive contacts, thereafter the electrical component is pressed against an elastic force of the support members in a direction to come close to the insulating substrate, thereby electrically connecting the conductive terminals and the lead terminals of the electrical component through the conductive contacts.

DESCRIPTION OF THE PREFERRED EMBODIMENTS

The present invention will be described in detail by way of its preferred embodiments shown in the accompanying drawings.

Figure 1:
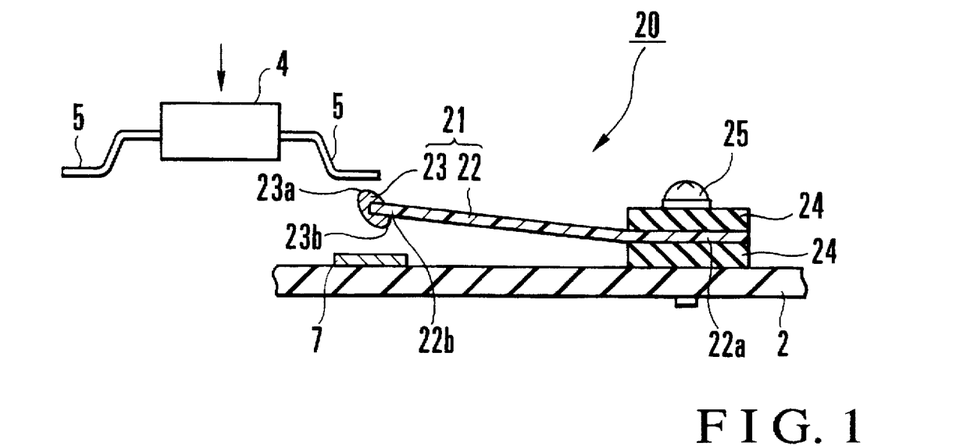
FIG. 1 is a sectional view showing an electronic component connector according to the first embodiment of the present invention.

FIGS. 1 to 4 show an electronic component connector according to the first embodiment of the present invention. Referring to FIG. 1, an electronic component connector 20 has two rows of a plurality of contact segments 21 corresponding to two rows of lead terminals 5 extending from an electronic component 4. In FIG. 1, for the sake of illustrative convenience, only the contact segments 21 corresponding to the lead terminals 5 on one side of the electronic component 4 are shown and the lead terminals on the other side that perform the same operation are omitted. Each contact segment 21 is constituted by a support member 22 made of an elastic insulating material, and a grain-like contact 23 made of a conductive material. A proximal end portion 22a of the support member 22 is fixed to a measurement circuit board 2 to provide a cantilever support structure. The contact 23 is provided to a free end portion 22b of the support member 22.

The support member 22 is made from an insulating material, e.g., a ceramic, into a thin belt having appropriate width, thickness, and length. The support member 22 is bent upward with a predetermined angle at its proximal end portion 22a side so that its free end portion 22b side gradually separates from the surface of the measurement circuit board 2. The proximal end portion 22a of the support member 22 is held by a pair of upper and lower holding members 24 and is fixed on the measurement circuit board 2 with a set screw 25 together with the holding members 24. In this embodiment, the support member 22 is bent upward. However, if the height of the lower holding member 24 is increased, the support member 22 need not be bent but can stay horizontal.

Figure 4:
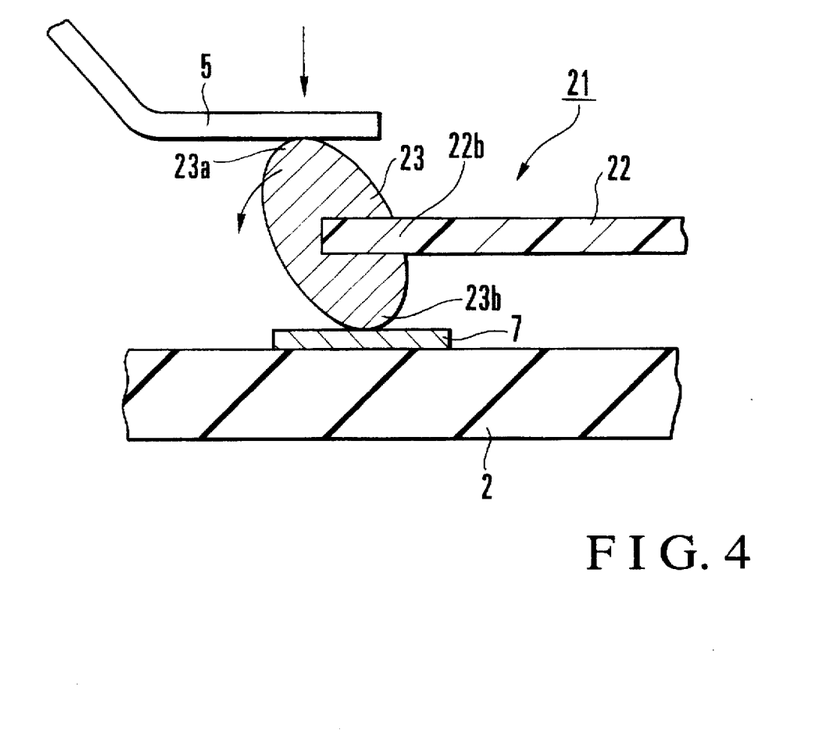
FIG. 4 is an enlarged sectional view of the electrical contacts in the state shown in FIG. 2.

The contact 23 provided at the free end portion 22b of the support member 22 is made of a metal, e.g., phosphor bronze, platinum, or the like into such a shape that its section taken along the longitudinal direction of the support member 22 forms an ellipse with a length of about 1 mm in the major axis. As shown in FIG. 4, the contact 23 is attached obliquely to the support member 22 such that its upper end portion is separate from the holding members 24 while its lower end portion is close to the holding members 24. The upper end of the contact 23 is located at the upper front position of the distal end of the free end portion 22b of the support member 22, thus forming a first contact portion 23a with respect to the corresponding lead terminal 5 of the electronic component 4. The lower end of the contact 23 is located at the lower rear position of the distal end of the free end portion 22b of the support member 22, thus forming a second contact portion 23b with respect to a corresponding terminal 7 formed on the measurement circuit board 2 to correspond to the contact 23.

Figure 2:
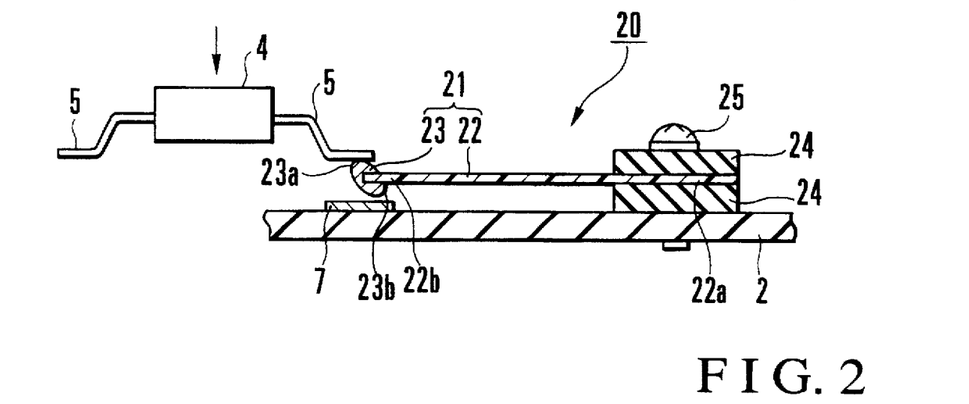
FIG. 2 is a sectional view wherein the lead terminals of the electronic component are pressed against conductive contacts from the state shown in FIG. 1.
Figure 3:
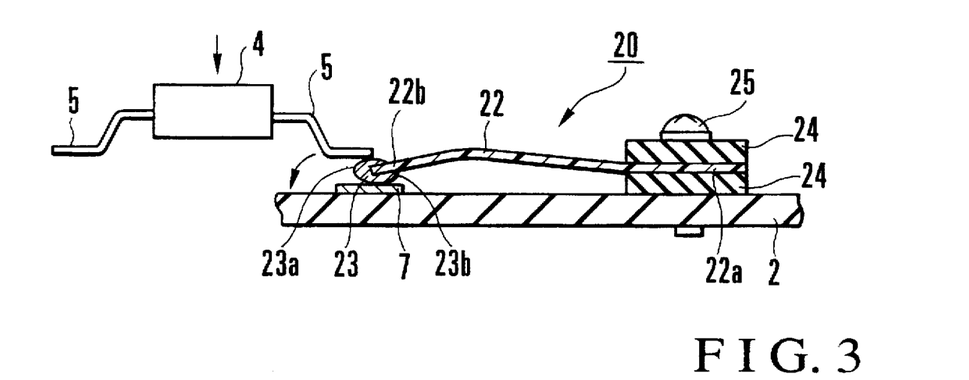
FIG. 3 is a sectional view showing a state during measurement wherein the lead terminals are further pressed against the conductive contacts from the state shown in FIG. 2.

In the electronic component connector 20 having the above structure, as shown in FIG. 1, the support member 22 is bent upward at a predetermined angle to incline with respect to the surface of the measurement circuit board 2 made of an insulating material, so that the contact 23 is separate upward from the conductive terminal 7. In this state, as shown in FIG. 2, the electronic component 4 is positioned and moved downward to press its each lead terminal 5 against the first contact portion 23a of the contact 23. Then, the support member 22 elastically deforms downward, i.e., in a direction to come close to the measurement circuit board 2, and the second contact portion 23b comes into contact with the terminal 7. When the electronic component 4 is further moved downward to press its each lead terminal 5 against the contact 23, the contact 23 pivots counterclockwise about almost the center as the pivot fulcrum until the major axis of the contact 23 becomes substantially parallel to the surface of the terminal 7, as shown in FIG. 3. At this time, the support member 22 elastically deforms such that its distal end-side central portion projects upward. While the contact area between the conductive contact 23 and the lead terminal 5 and that between the conductive contact 23 and the terminal 7 are large, the characteristic measurement of the electronic component 4 is performed.

Figure 5A:
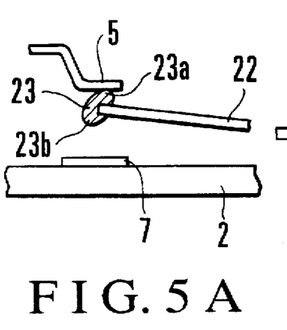
FIGS. 5A to 5C are views for explaining how to attach the conductive contacts in a different manner.
Figure 5B:
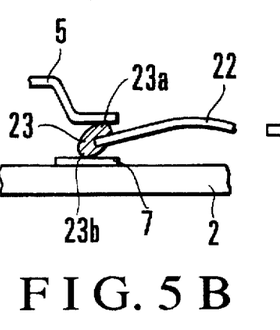
Figure 5C:
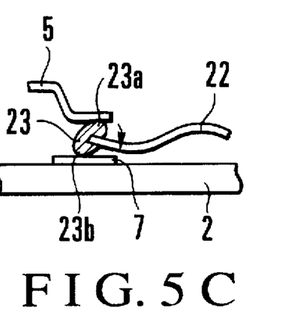

In this case, as shown in FIG. 5A, when the contact 23 is mounted to be inclined in the opposite direction to that shown in FIG. 4 so that its first contact portion 23a is located at the upper rear position of the distal end of the free end portion 22b of the support member 22 and its second contact portion 23b is located at the lower front position of the distal end of the free end portion 22b of the support member 22, as the lead terminal 5 is moved downward, the support member 22 is bent downward at its central portion and the contact 23 comes into contact with the terminal 7, as shown in FIG. 5B. Thereafter, as shown in FIG. 5C, the support member 22 deforms elastically substantially into an S-shape. In this state, characteristic measurement of the electronic component 4 is performed.

In this manner, when the support member 22 and the contact 23 constituting the contact segment 21 are formed of separate members, the contact 23 can be formed into a grain-like shape or a small segment and need not have elasticity. For this reason, the degree of freedom in selecting the material of the contact 23 increases, thereby improving the durability and making the contact 23 small. Since the support member 22 is formed of an insulating material separately of the contact 23, its length, thickness, rigidity, amount of elastic deformation, and the like can be determined freely, so that a difference in amount of deformation caused by variations in height precision of the lead terminals 5 can be absorbed. The material of the support member 22 is not limited to ceramics. If the contact pressure is not strictly defined, an inexpensive support member made of a synthetic resin, e.g., a glass-reinforced epoxy resin, may be used.

When the contact 23 pivots upon being pressed by the lead terminal 5, its first and second contact portions 23a and 23b respectively come into slidable contact with the lead terminals 5 and 7, thus performing a wiping action. Therefore, the oxide films and contamination on the surfaces of the respective contact portions of the contact 23 and the lead terminal 5, and of the contact 23 and the terminal 7 are removed, thus obtaining good electrical contact with a low contact resistance.

Figure 6:
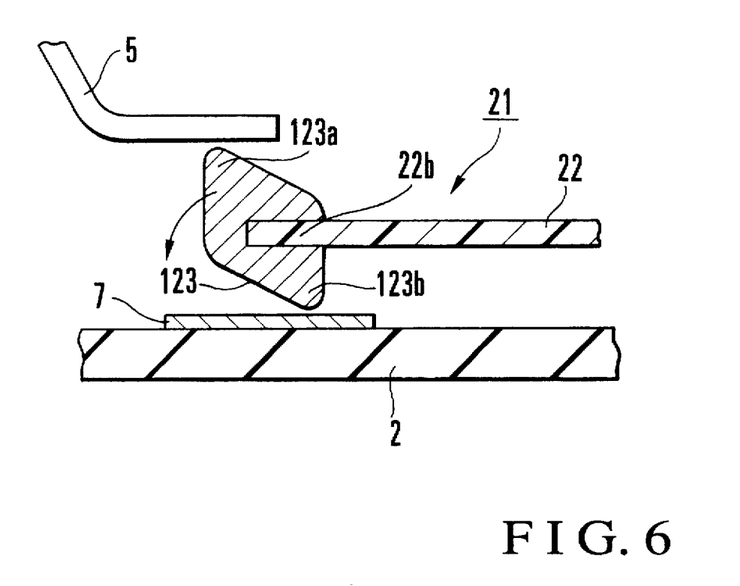
FIG. 6 is a sectional view of a contact portion showing the second embodiment of the present invention.

FIG. 6 shows a contact portion according to the second embodiment of the present invention. In this embodiment, a contact 123 is formed into a small segment having a rhombic section taken in the longitudinal direction of a support member 22. The upper and lower acute-angled portions of the contact 123 form first and second contact portions 123a and 123b. The contact 123 is mounted on a support member 22 such that one of its first and second contact portions 123a and 123b is located in front of the distal end of a free end portion 22b and the remaining one of its first and second contact portions 123a and 123b is located behind the distal end of the free end portion 22b. A lead terminal 5 is pressed against the contact 123 with a predetermined pressure to pivot the contact 123, so that a flat lower surface 125 of the contact 123 comes into tight contact with the surface of a terminal 7.

In this structure, since the lower surface 125 of the contact 123 serves as a stopper that defines the pivot angle of the contact 123, the contact pressure need not be set strictly.

Figure 7:
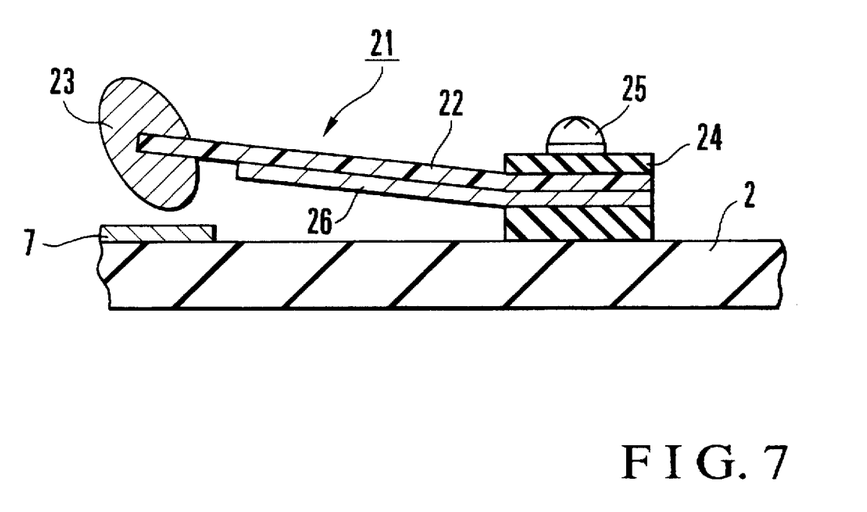
FIG. 7 is a sectional view of a support member portion showing the third embodiment of the present invention.

FIG. 7 shows a contact segment portion according to the third embodiment of the present invention. In this embodiment, a leaf spring 26 made of a thin metal plate overlaps a support member 22 made of an insulating material except for a free end portion 22b of the support member 22, and a contact 23 is provided to the free end portion 22b of the support member 22. The leaf spring 26 ensures the stroke of the contact 23 and the contact pressure between the contact 23 and a lead terminal 5. The leaf spring 26 is formed shorter than the support member 22 and overlaps the support member 22 such that its proximal end side matches with that of the support member 22, thereby preventing the leaf spring 26 from coming into electrical contact with the contact 23. In this structure, since the stroke of the contact 23 and the contact pressure between the contact 23 and lead terminal 5 are ensured by the elasticity of the leaf spring 26, the support member 22 can be fabricated by an inexpensive material, e.g., a synthetic resin, thus decreasing the manufacturing cost of the connector.

Figure 8:
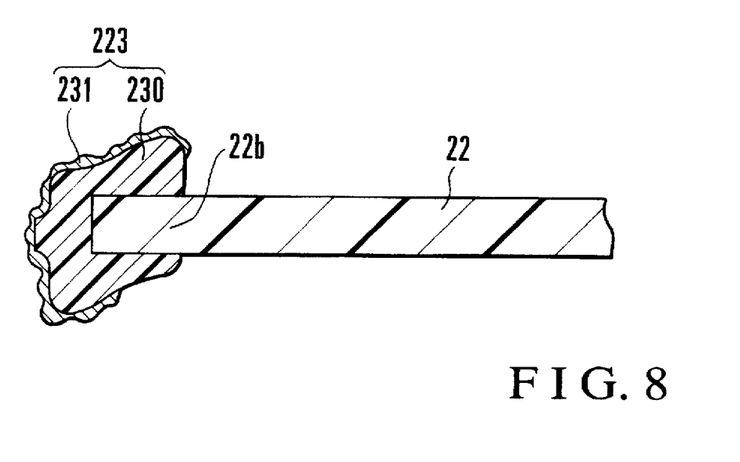
FIG. 8 is a sectional view of a conductive contact portion showing the fourth embodiment of the present invention.

FIG. 8 shows a contact portion according to the fourth embodiment of the present invention. In this embodiment, a small segment-like main body 230 is formed of an elastic synthetic resin, e.g., a glass-reinforced epoxy resin, an engineering plastic, or the like, to have a rhombic section, as shown in FIG. 6. A conductive portion 231 having an uneven surface is formed on the surface of the main body 230 by plating, spray coating, or the like, to constitute a contact 223. The contact 223 is bonded by welding or the like to a free end portion 22b of a support member 22 made of an insulating material. When forming the conductive portion 231 by plating, the surface of the main body 230 is plated with an underlying Ni-plated layer of about, e.g., 5 μm, and is then plated with rigid gold to a thickness of about 1 μm.

In this structure, since unevenness is formed on the surface of the conductive portion 231, when the contact 223 pivots as it is pressed against the lead terminal of the electronic component, the contamination, oxide films, and the like on the surface of the lead terminal can be removed well. Therefore, good electrical connection is obtained between the lead terminal and the contact 223.

Figure 9:
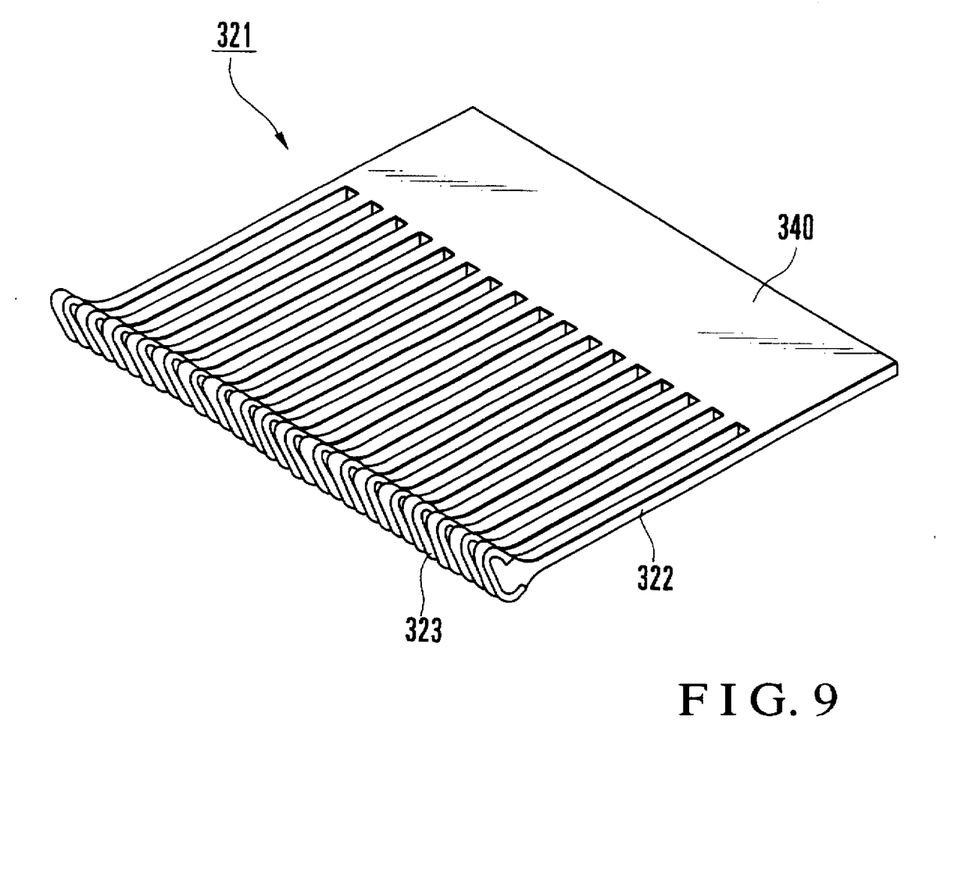
FIG. 9 is a perspective view of a contact segment unit showing the fifth embodiment of the present invention.
Figure 10A:
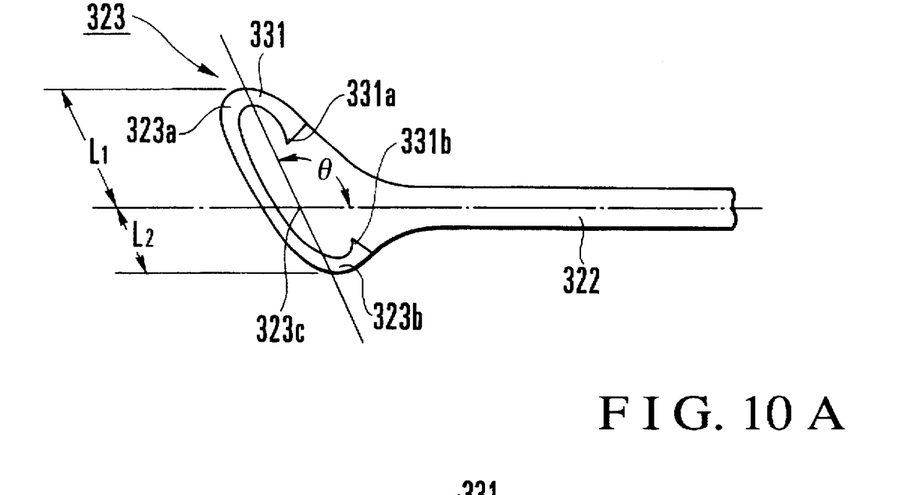
FIGS. 10A is an enlarged side view of the conductive contact shown in FIG. 9.
Figure 10B:
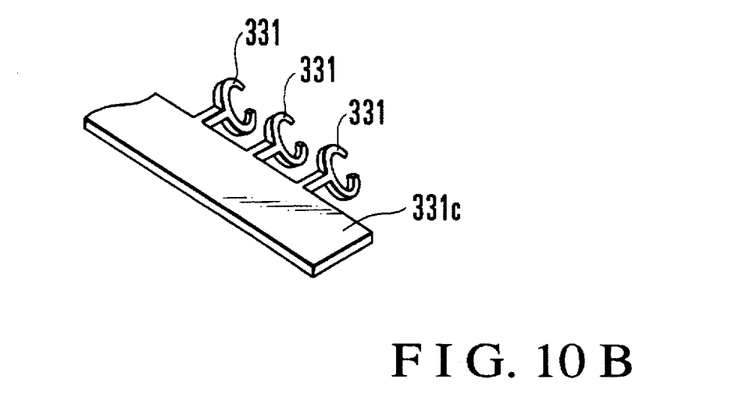
FIG. 10B is a perspective view of a conductive portion for explaining the manufacturing process of the contact segment unit.

FIG. 9 shows a contact segment portion according to the fifth embodiment of the present invention, FIG. 10A shows a contact element shown in FIG. 9, and FIG. 10B shows a conductive portion for explaining the manufacturing process of a contact segment unit. In this embodiment, as shown in FIG. 9, a plurality of comb-toothed support members 322 having elasticity and insulating properties and contacts 323 integrally formed at the free end portions of the support members 322 by plastic molding (injection molding, compression molding, or the like) constitute a contact segment unit 321. The support members 322 are made of a plastic material, e.g., an engineering plastic, having a high modulus of elasticity, and their base portions are coupled to each other with a coupling portion 340. The gap between the support members 322 is equal to the pitch of the lead terminals of an electronic component to be measured.

As shown in FIG. 10A, each contact 323 has a shoe-shaped side surface and is inclined with respect to the corresponding support member 322 at an angle (θ) larger than 90°. A conductive portion 331 having a predetermined thickness is formed in a recessed portion of the contact 323 formed to extend from the instep to the toe, the sole, and the heel portion. In this contact 323, the toe portion extending upward from the support member 322 constitutes a first contact portion 323a, against which the lead terminal of the electronic component to be measured is pressed. The heel portion extending downward from the support member 322 constitutes a second contact portion 323b, which is pressed against the terminal of the measurement circuit board. Lengths L1 and L2 of the conductive portion 331 corresponding to the first and second contact portions 323a and 323b differ, such that the conductive portion 331 corresponding to the second contact portion 323b is shorter than the conductive portion 331 corresponding to the first contact portion 323a. This aims at prolonging the service life by preventing wear of the terminals of the measurement circuit board constituting the measurement apparatus, while reliably allowing a wiping action against the terminals of the electronic component to be measured. More specifically, when a pivot fulcrum 323c of the contact 323 is shifted from almost the center of the contact 323 to the second contact portion 323b side, the wiping amount of the first contact portion 323a becomes larger than that of the second contact portion 323b.

Since the contact 323 is brought into reliable contact with the terminal of the measurement circuit board having a good surface state even with a small wiping amount, the wiping amount of the measurement circuit board is decreased to prolong the service life of the measurement circuit board which is expensive. The contact 323 can be brought into reliable contact with the terminal of a component to be measured having a poor surface state by increasing the wiping amount.

In the contact segment unit 321, a metal portion constituting the conductive portion and the support members 322 are integrally formed by plastic molding. In this case, as shown in FIG. 10A, wedge-shaped projections 331a and 331b are provided to the two ends of the conductive portion 331 to improve the adhesion strength between the plastic and the metal of the conductive portion. To integrally form the contact segment unit 321, the conductive portions 331 are projected from a belt-like metal plate 331c at the same pitch as that of the terminals of the electronic component to be measured. Then, the support members 322 and the contacts 323 are formed integrally by plastic molding, and the belt-like metal plate 331c is separated from the conductive portions 331. As the metal material, gold, a silver-tungsten alloy, a gold-platinum-palladium-silver-copper-zinc-nickel seven-element alloy, e.g., SP-1 (Tradename of Tanaka Kikinzoku K.K.), or the like is used.

To form the contact segment unit 321, one end of a plate-like member may be formed in accordance with the shape of the contacts 323, and the recessed portion may be entirely plated with a metal. Alternatively, a conductive material may be adhered to a plastic member and common conductive portions 331 may be formed. Thereafter, the support members 322 may be formed into the comb-toothed shape.

In the fifth embodiment, the plurality of support members 322 are coupled to each other at their proximal end portions through the coupling portion 340. However, a separate contact segment may be integrally formed by plastic molding with a separate support member 322 and a separate conductive portion 331, and thereafter a plurality of contact segments each obtained in this manner may be arranged at a pitch equal to the terminal pitch of an electronic component to be measured and fixed on a board.

In this structure, since the contacts 323 having the conductive portions 331 are integrally formed at the free end portions of the support members 322, an operation of mounting separate small segment-like contacts afterwards becomes unnecessary. Thus, a connector having good productivity and uniform quality can be manufactured.

According to this embodiment, since electronic components are manufactured by mass production, their terminals are treated by, e.g., inexpensive solder plating. For this reason, oxide films may be formed on the surfaces of the terminals or these terminals may be soiled, often forming electrically insulating layers. Accordingly, the terminals of the electronic components must perform a large wiping action. In general, the surfaces of the terminals of the measurement circuit board of a measurement apparatus are treated by, e.g., gold plating, in order to obtain reliable conduction. Therefore, the terminals of the board can obtain reliable conduction even with a small wiping action.

Since a measurement circuit is constituted on the measurement circuit board, the measurement circuit board is very expensive. Hence, it is demanded that wear of the terminal portions integrally formed with this measurement circuit, which is caused by slidable contact of the contact, be decreased, so that the service life can be prolonged by decreasing wear.

From these respects, if the second contact portion (board terminal side) of each contact is made shorter than the first contact portion (electronic component side), the pivot fulcrum is shifted downward (second contact portion side) from almost the center of the contact, and the wiping amount at the second contact portion is decreased while maintaining a large wiping amount at the first contact portion, reliable conduction can be obtained while prolonging service life by decreasing wear of the terminals of the measurement circuit board.

In any of the respective embodiments described above, the support member is formed as a thin plate. However, the support member may be a linear member. A measurement circuit board on which conductive terminals are formed was described as the side to be pressed. However, another electrical component having fixed terminals may be employed as the side to be pressed. The support member may be made of an insulating metal as far as it has spring properties, and may be made of a conductive metal as far as the conductive contacts are insulated from each other.

As has been described above, in the electronic component connector according to the present invention, since the length of each contact itself can be decreased when compared to that of a conventional metal contact having elasticity, a contact having a low impedance and a small stray capacitance can be obtained. Also, since the measurement error is small, this connector is suitably used in characteristic measurement of an electronic component having particularly high-frequency characteristics. The contact pivots upon being pressed by the terminal of the electronic component to absorb variations in height accuracy of the terminal and to perform a wiping action. Thus, a contact resistance with the terminal becomes low, thus obtaining good electrical connection. Since the support member can be fabricated separately from the contact, the rigidity, the length, and the like of the support member can be determined freely.

What is claimed is:

1. An electronic component connector for very high frequency use comprising:

a plurality of conductive terminals formed on an insulating substrate;

a plurality of belt-like support members provided on said insulating substrate to correspond to said conductive terminals, said support members made of an elastic insulating material and respectively having free end portions arranged in a row to correspond to a plurality of lead terminals extending from an electrical component and proximal end portions cantilevered by said insulating substrate; and a plurality of conductive contacts insulated from each other and provided to said free end portions of said support members to normally oppose said conductive terminals through a predetermined gap, said conductive contacts forming a structure distinct from said support member and respectively having first contact portions arranged to come into contact with said lead terminals of the electrical component and second contact portions arranged to come into contact with said terminals at positions, in a longitudinal direction of said support members, different from positions where said first contact portions come into contact with said terminals, wherein said lead terminals of the electrical component are positioned to correspond to said conductive contacts, thereafter the electrical component is pressed against an elastic force of said support members in a direction to come close to said insulating substrate, thereby electrically connecting said conductive terminals and said lead terminals of the electrical component through said conductive contacts.

2. A connector according to claim 1, wherein said conductive contacts respectively have elliptic sections taken along the longitudinal direction of said support members.

3. A connector according to claim 1, wherein said conductive contacts respectively have parallelogram sections taken along the longitudinal direction of said support members.

4. A connector according to claim 1, wherein said support members are made of an insulating material, and said conductive contacts are made of grains of a conductive material.

5. A connector according to claim 1, wherein said conductive contacts have unevenness on surfaces thereof.

6. A connector according to claim 1, wherein said first contact portions are located at an upper front position of said free end portions of said support members, and said second contact portions are located at a lower rear position of said free end portions of said support members.

7. A connector according to claim 1, further comprising belt-like leaf springs which overlap said support members except for said free end portions thereof.

8. A connector according to claim 1, wherein said conductive contacts are respectively constituted by contact main bodies fixed to said free end portions of said support members and made of a synthetic resin and conductive films formed on surfaces of said contact main bodies.

9. A connector according to claim 8, wherein said contact main bodies are integrally formed of a synthetic resin at said free end portions of said support members, and a line connecting each of said first contact portions and a corresponding one of said second contact portions intersects a corresponding one of said support members at a predetermined angle.

10. A connector according to claim 1, wherein said support members are integrally formed such that said proximal end portions thereof are coupled to each other, and said free end portions of said support members are formed into a comb-toothed shape from a common proximal end portion of said support members.

11. A connector according to claim 9, wherein said second contact portions of said conductive contacts are formed shorter than said first contact portions, and a pivot fulcrum of each of said conductive contacts is located close to a corresponding one of said second contact portions than a substantial center thereof.

12. A connector according to claim 11, wherein each of said conductive contacts has an inclined shoe-shaped side surface in which a toe portion thereof is located in front of a heel portion thereof in the longitudinal direction of said support members.

13. A connector according to claim 12, wherein each of said conductive films is formed to extend from an instep portion to said toe portion, a sole portion, and to said heel portion of said shoe-shaped conductive contact to have a predetermined thickness.

14. A connector according to claim 1, wherein said free end portions of said support members are connected to said conductive contacts such that said connection occurs at or substantially adjacent to the center of said conductive contacts.

15. A connector according to claim 1, wherein each of said support members made of said elastic insulating material, elastically deforms as said lead terminals come in contact with each of said conductive contacts to allow said conductive contacts to pivot causing said first and second contact portions to come into slidable contact with said lead terminals and said conductive terminals respectively.

16. A connector according to claim 1, wherein said support member further includes a central portion, said support member elastically deforms so that said central portion projects upward when said lead terminals come in contact with said conductive contacts.

17. An electronic component connector comprising:
   a plurality of belt-like elastic support members provided on an insulating substrate, said support members made of an elastic insulating material and respectively having free end portions arranged in a row to correspond to a plurality of lead terminals extending from first and second electrical components and proximal end portions cantilevered by said insulating substrate; and
   conductive contacts insulated from each other and provided to said free end portions of said support members to normally oppose said terminals of said second electrical component through a predetermined gap, said conductive contacts forming a structure distinct from said support member and respectively having first contact portions arranged to come into contact with said conductive terminals of the first electrical component and second contact portions arranged to come into contact with said conductive terminals of the second electrical component at positions, in a longitudinal direction of said support members, different from positions where said first contact portions arranged to come into contact with said conductive terminals of the first electrical component,
   wherein said conductive terminals of the first and second electrical components are positioned to correspond to said conductive contacts, and thereafter the first electrical component is pressed against an elastic force of said support members in a direction to come close to the second electrical component, thereby electrically connecting said conductive terminals of the first and second components through said conductive contacts.

* * * * *